(12) United States Patent
Joo et al.

(10) Patent No.: US 8,211,739 B2
(45) Date of Patent: *Jul. 3, 2012

(54) POLYCRYSTALLINE SILICON SOLAR CELL HAVING HIGH EFFICIENCY AND METHOD FOR FABRICATING THE SAME

(75) Inventors: Seung Ki Joo, Seongnam-si (KR); Hyeong Suk Yoo, Yongin-si (KR); Young Su Kim, Seoul (KR); Nam Kyu Song, Chungcheongnam-do (KR)

(73) Assignee: SNU R&DB Foundation, Seoul (KR)

( * ) Notice: Subject to any disclaimer, the term of this patent is extended or adjusted under 35 U.S.C. 154(b) by 585 days.

This patent is subject to a terminal disclaimer.

(21) Appl. No.: 12/355,098

(22) Filed: Jan. 16, 2009

(65) Prior Publication Data

US 2009/0178711 A1 Jul. 16, 2009

(30) Foreign Application Priority Data

Jan. 16, 2008 (KR) .................. 10-2008-0004837

(51) Int. Cl.
*H01L 21/00* (2006.01)
(52) U.S. Cl. .......... 438/97; 438/96; 257/E21.127
(58) Field of Classification Search .............. 438/96, 438/97; 257/E21.127
See application file for complete search history.

(56) References Cited

U.S. PATENT DOCUMENTS

| | | | |
|---|---|---|---|
| 2003/0030052 A1* | 2/2003 | Oka et al. | 257/65 |
| 2004/0263707 A1* | 12/2004 | Seo et al. | 349/43 |
| 2006/0252235 A1* | 11/2006 | Aberle et al. | 438/478 |

OTHER PUBLICATIONS

U.S. Appl. No. 12/355,078.*

* cited by examiner

*Primary Examiner* — Matthew Reames
(74) *Attorney, Agent, or Firm* — Rosenberg, Klein & Lee

(57) ABSTRACT

Disclosed herein is a polycrystalline silicon solar cell, including: a back electrode formed on a transparent insulating substrate; an N-type polycrystalline silicon layer in which amorphous silicon is crystallized through MIC process, and in which electrons are accumulated; a light-absorbing layer which is formed by vertically crystallizing an intrinsic amorphous silicon layer using the polycrystalline silicon layer as a seed for crystallization through MIVC process, in which pairs of electrons and holes are generated in response to incident light, and which has a vertical column grain structure in which grains are arranged in the direction in which electrons and holes move; a P-type polycrystalline silicon layer which has the vertical column grain structure, and in which holes are accumulated; a transparent electrode layer; front electrodes; and an antireflection coating film, and is a method of fabricating the same.

15 Claims, 7 Drawing Sheets

POLYCRYSTALLINE SILICON SOLAR CELL HAVING HIGH EFFICIENCY AND METHOD FOR FABRICATING THE SAME

BACKGROUND OF THE INVENTION

1. Field of the Invention

The present invention relates to a polycrystalline silicon solar cell having a high efficiency and a method of fabricating the same, and, more particularly, to a method of forming a light-absorbing layer of a polycrystalline silicon solar cell, in which the light-absorbing layer is formed of non-polluted polycrystalline silicon using a metal-induced lateral crystallization (MILC) process, and grains of the polycrystalline silicon are vertically grown in the direction in which electrons and holes move using a metal-induced vertical crystallization (MIVC) process in which the polycrystalline silicon is used as a crystallization seed, so that the particle structure of the polycrystalline silicon is formed into a vertical columnar structure, with the result that the number of grain boundaries, acting as sites in which electrons and holes are recombined with each other, is minimized, thereby increasing the efficiency of a solar cell, to a high-efficiency polycrystalline silicon solar cell using the light-absorbing layer, and to a method of fabricating the high-efficiency polycrystalline silicon solar cell.

2. Description of the Related Art

It has been 50 years or more since Belldusrnthdml Chapin, Fuller, Pearson et al. in the U.S. developed a solar cell in 1954. The solar cell had been chiefly used as an independent power source for remote places, such as a power source for space or the like, till the middle of the 1960's. However, owing to the oil crisis in the 1970's, the research and development of the solar cell has sought to produce cheap solar cells such that the solar cell can compete with commercial power supply systems. Thus, currently, the solar cell can be used as a power source for ground devices.

Solar photovoltaic power generation, which is a technology of directly converting solar energy into electric energy using a photovoltaic effect, is a future energy source which is being put to practical use for the first time due to the fact that solar energy is a permanent resource which does not cause thermal and environmental pollution and will not be exhausted so long as the sun exists.

Currently, wafer-type silicon solar cells are commercially used, and account for 80% or more of world solar cell market share. The price of the raw material of a silicon wafer is the most important among the factors determining the price of wafer-type silicon solar cells.

A single-crystalline silicon (c-Si) solar cell is manufactured using a substrate having a thickness of 300~400 μm, but, actually, the thickness of silicon which is sufficient to absorb light and generate electricity in a solar cell is 50 μm. However, when an ingot is cut into a silicon wafer, it is difficult to cut it to have a thickness of 300 μm or less, and the silicon wafer can be damaged in subsequent processes, so that it is impossible to manufacture a solar cell having a thickness of 300 μm or less.

Further, since only about 1% (several um) of the amount of the silicon used in a single-crystalline silicon (c-Si) solar cell is used to form a thin film on a substrate in a silicon thin film solar cell, a solar cell can be manufactured at low cost. Further, since the silicon thin film solar cell has a laminate structure, solar light is efficiently used, and thus the efficiency of a solar cell can also be improved.

In order to solve the above problem of such a wafer-type silicon solar cell, technologies of manufacturing a solar cell by depositing a silicon thin film on a cheap glass substrate have been earnestly researched from the 1980's. For example, there is an amorphous silicon (a-Si) thin film solar cell. This a-Si thin film solar cell is manufactured by vacuum-depositing an amorphous silicon thin film having a thickness of 1 μm or less on a cheap glass substrate. In this technology of manufacturing the a-Si thin film solar cell, its production cost can be decreased by reducing the thickness of the silicon constituting the a-Si thin film solar cell, but the a-Si thin film solar cell manufactured using this technology has basic problems in that its efficiency is lower than that of the single-crystalline silicon (c-Si) solar cell and in that its properties are deteriorated by the Staebler-Wronski' effect when it is exposed to light for a long period of time. The basic problems have not been completely solved yet although 20 years have passed since then. It is analyzed that the reason why this a-Si thin film solar cell has low efficiency and stability is that its silicon thin film, which is a light-absorbing layer, is amorphous.

Therefore, when a solar cell is manufactured using a crystalline silicon thin film, instead of an amorphous silicon thin film, as a light-absorbing layer, there are advantages in that the efficiency of the solar cell manufactured in this way can be increased to a level of that of a c-Si wafer solar cell and in that the production cost thereof can be decreased to a level of that of an a-Si thin film solar cell. Further, since a module using a glass substrate can be used as a window for a building, the module can be fabricated at relatively low cost. Moreover, since the module can be converted into a flexible module using a metal substrate, it can be used in various applications.

In order to decrease the production cost of a solar cell and to increase the efficiency thereof, a technology for forming a high-quality crystalline silicon thin film at a temperature of 500° C. or lower at which a cheap glass substrate does not deform must be first developed.

Methods of forming a polycrystalline silicon thin film at low temperature largely include two methods, that is, a method of directly forming a polycrystalline silicon thin film and a method of forming an amorphous silicon thin film and then converting amorphous silicon included in the amorphous silicon thin film into polycrystalline silicon through subsequent processes.

The former method of directly forming a polycrystalline silicon thin film is frequently performed using a chemical vapor deposition (CVD) method. In the chemical vapor deposition (CVD) method, a raw material, such as $SiH_4$, is decomposed by the energy generated through plasma enhanced chemical vapor deposition (PECVD) or hot-wire chemical vapor deposition (HWCVD), and is then formed into a silicon thin film. However, in the case of the PECVD system, it is known that a process of forming a silicon thin film is excessively sensitive to the temperature of a substrate, and the silicon thin film formed using this PECVD system is very porous. Further, in the case of the HWCVD system, it is difficult to apply the HWCVD system to a large area system, this HWCVD system cannot be easily used to manufacture a solar cell.

The latter method of forming an amorphous silicon thin film and then crystallizing amorphous silicon thin film included in the amorphous silicon thin film includes a method of crystallizing amorphous silicon using a laser and a method of crystallizing amorphous silicon using a metal catalyst. Among them, the method of crystallizing amorphous silicon using a laser is not suitable for a process of manufacturing a solar cell, the process necessarily requiring a large area, because high-priced equipment is used.

A method of crystallizing amorphous silicon using a metal catalyst, such as nickel (Ni), palladium (Pd), gold (Au), aluminum (Al) or the like, is called metal induced crystallization (MIC). When this MIC is directly used to manufacture a solar cell, a large-sized polycrystalline silicon thin film can be formed, but the efficiency of a solar cell is decreased due to the contamination of metals included in the polycrystalline silicon, and thus it is difficult to manufacture a high-efficiency solar cell. Therefore, it is required to develop a crystallization technology which can minimize the metal contamination.

Hereinafter, the metal contamination causing the decrease in efficiency of a solar cell will be described in more detail with reference to the accompanying drawings.

Figure 1:
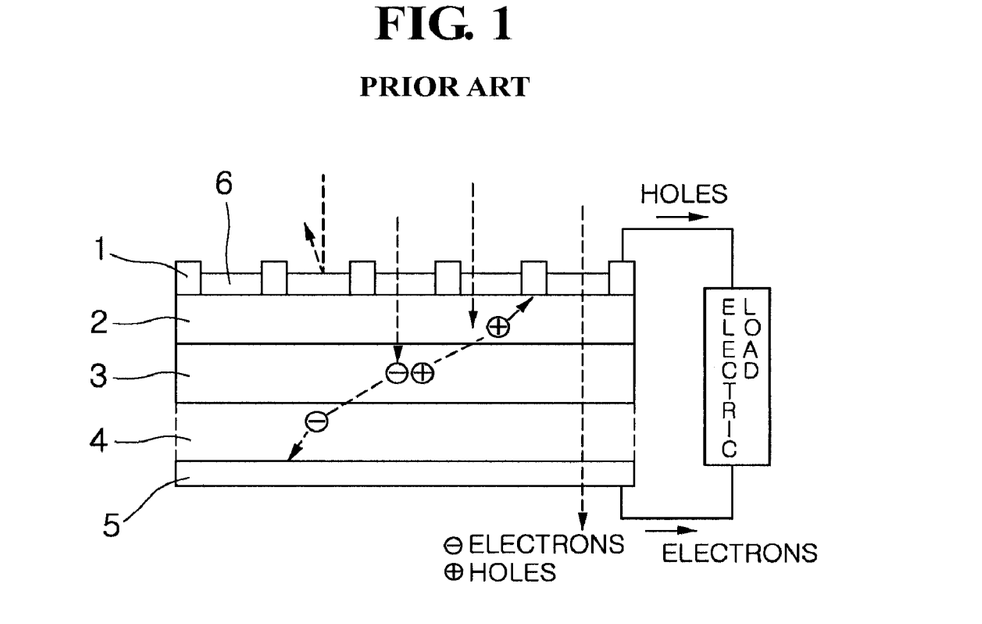
FIG. 1 is a schematic sectional view showing a structure of a conventional solar cell.

FIG. 1 is a schematic sectional view showing a structure of a conventional solar cell.

Referring to FIG. 1, a conventional solar cell has a PIN structure including a P-type silicon layer 2, a light-absorbing layer 3 and an N-type silicon layer 4. A front electrode 1 is formed on the P-type silicon layer 2, a back electrode 5 is formed beneath the N-type silicon layer 4, and an anti-reflection film 6 is formed on the front electrode 1.

The principle of the solar cell is as follows. When light reaches the light-absorbing layer 3 via the anti-reflection film 6 and the P-type silicon layer 2, a pair of holes and a pair of electrons are generated in the light-absorbing layer 3, and the pair of holes and the pair of electrons are respectively moved to the P-type silicon layer 2 and N-type silicon layer 4 by the internal electric fields formed in the P-type silicon layer 2 and N-type silicon layer 4. In this case, holes accumulate in the P-type silicon layer 2, and electrons accumulate in the N-type silicon layer 4, so that an electric current is generated from the front electrode 1 and back electrode 5 connected to the respective P-type silicon layer 2 and N-type silicon layer 4, thereby constituting a cell.

Here, the efficiency of a cell is determined depending on the amount of holes and electrons accumulated in the cell when a constant amount of light reaches the cell. That is, the efficiency thereof is determined by decreasing the defects, serving as the recombination sites of the electrons and holes generated from the light-absorbing layer.

When the amorphous silicon included in the light-absorbing layer 3 is crystallized using the MIC method, a large amount of catalytic metal is present in the light-absorbing layer 3. When these metal impurities (pollutants) in the light-absorbing layer 3 are increased, the pairs of holes and electrons generated by light are separated by the internal electric fields, and are thus recombined with the holes and electrons present in the metal impurities before they reach the P-type silicon layer 2 and N-type silicon layer 4, so that they are not accumulated in the P-type silicon layer 2 and N-type silicon layer 4.

Consequently, with the increase in the amount of metal impurities present in the light-absorbing layer 3, the recombination frequency of holes and electrons is increased, thus decreasing the charge accumulation rate of a cell, that is, the efficiency of a cell.

Meanwhile, Korean Unexamined Patent Application Publication No. 2006-100806 discloses a thin film solar cell, in which a P-type silicon layer, which is an active layer having a P-N junction structure, has grains laterally grown through lateral crystallization, so that the flow of electrons is not obstructed by a grain boundary, with the result that the loss of electrons is reduced, thereby improving light efficiency.

Since sequential lateral crystallization (SLC) using a laser is used in this technology, problems related to the recombination of holes and electrons due to catalytic metals do not occur, but this technology is problematic in that large-area amorphous silicon cannot be efficiently crystallized and in that productivity is low compared to crystallization heat treatment using a furnace.

Meanwhile, in the case of a polycrystalline silicon solar cell, grain boundaries act as recombination defects, that is, recombination sites of electrons and holes, and thus it is required to control the grain boundaries.

Figure 2:
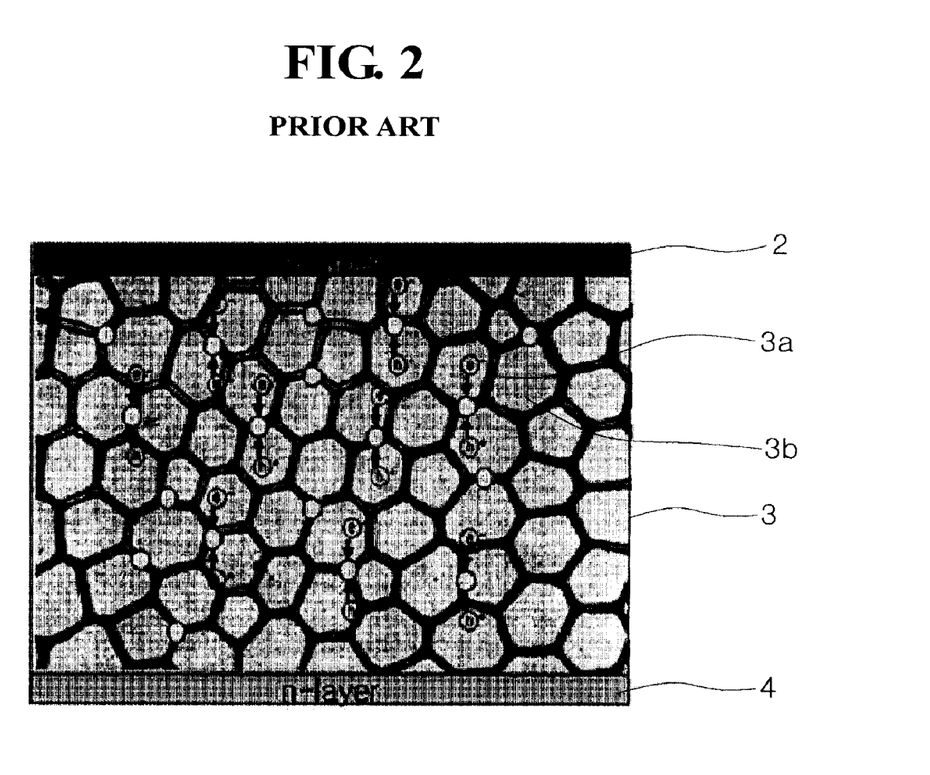
FIG. 2 is a sectional view showing the recombination of holes and electrons through grain boundaries when grains are randomly grown in a conventional polycrystalline silicon light-absorbing layer.

FIG. 2 is a sectional view showing the recombination of holes and electrons through grain boundaries 3a when grains 3b are randomly grown in a conventional polycrystalline silicon light-absorbing layer 3. As shown in FIG. 3, a P-type silicon layer 2 is formed on the light-absorbing layer 3, and an N-type silicon layer 4 is formed beneath the light-absorbing layer 3.

When the light-absorbing layer 3 is formed by crystallizing amorphous silicon into polycrystalline silicon using a conventional crystallization method, as shown in FIG. 2, grains 3b are randomly grown, so that a plurality of grain boundaries 3a, acting as the recombination sites of electrons ($e^-$) and holes ($h^+$) generated from the light-absorbing layer 3, is formed, with the result that there is a problem in that the efficiency of a solar cell is decreased.

SUMMARY OF THE INVENTION

Accordingly, the present invention has been made keeping in mind the above problems occurring in the prior art, and an object of the present invention is to provide a method of fabricating a high efficiency polycrystalline silicon solar cell, in which a light-absorbing layer is formed of non-polluted polycrystalline silicon using a metal-induced lateral crystallization (MILC) method, and grains of the polycrystalline silicon are vertically grown in the direction in which electrons and holes move using a metal induced vertical crystallization (MIVC) method in which the polycrystalline silicon is used as a crystallization seed, with the result that grain boundaries, acting as sites in which electrons and holes are recombined with each other, is minimized, thereby increasing the efficiency of a solar cell.

Another object of the present invention is to provide a method of fabricating a high efficiency polycrystalline silicon solar cell, in which the particle structure of the polycrystalline silicon used to make a light-absorbing layer is formed into a vertical columnar structure, so that grain boundaries, acting as sites in which electrons and hole are recombined with each other, is minimized, thereby increasing the efficiency of a solar cell.

A further object of the present invention is to provide a method of fabricating a polycrystalline silicon solar cell, in which amorphous silicon is vertically crystallized using a metal induced vertical crystallization (MIVC) method and then metal and silicide are removed from the crystallized region, and thus the crystallization of an amorphous silicon thin film is realized without the contamination of metals, thereby fabricating a solar cell having excellent properties.

A still further object of the present invention is to provide a method of forming a light-absorbing layer for a polycrystalline silicon solar cell and a method of fabricating a polycrystalline silicon solar cell using the light-absorbing layer, in which amorphous silicon is crystallized using a metal induced crystallization (MIC) method and a metal induced lateral crystallization (MILC) method, and thus several substrates can be simultaneously crystallized at a relatively low temperature of 300~500° C. using a furnace without damaging a glass substrate, thereby improving productivity.

In order to accomplish the above objects, an aspect of the present invention provides a polycrystalline silicon solar cell, including: (a) a back electrode formed on a transparent insulating substrate; (b) an N-type polycrystalline silicon layer formed on the back electrode, in which amorphous silicon is crystallized through a metal induced crystallization (MIC) process, and in which electrons are accumulated; (c) a light-absorbing layer formed on the N-type polycrystalline silicon layer, which is formed by vertically crystallizing an intrinsic amorphous silicon layer using the polycrystalline silicon layer as a seed for crystallization through a metal induced vertical crystallization (MIVC) process, in which pairs of electrons and holes are generated in response to incident light, and which has a vertical column grain structure in which grains are arranged in the direction in which electrons and holes move; (d) a P-type polycrystalline silicon layer formed on the light-absorbing layer, which is formed using the same method as in the light-absorbing layer, which has the same vertical column grain structure as the light-absorbing layer, and in which holes are accumulated; (e) a transparent electrode layer formed on the P-type polycrystalline silicon layer; (f) front electrodes formed on the transparent electrode layer; and (g) an antireflection coating film covering the front electrodes and the transparent electrode layer.

Another aspect of the present invention provide a method of forming a light-absorbing layer of a polycrystalline silicon solar cell, including the steps of: (a) forming a polycrystalline silicon layer on a back electrode; (b) forming an intrinsic amorphous silicon layer on the polycrystalline silicon layer; and (c) heat-treating the transparent insulating substrate to vertically crystallize the intrinsic amorphous silicon layer using the polycrystalline silicon layer as a seed for crystallization through a metal induced vertical crystallization (MIVC) process to form the intrinsic amorphous silicon layer into a light-absorbing layer made of polycrystalline silicon.

In the method of forming a light-absorbing layer, the step of forming the polycrystalline silicon layer may include: (a-1) forming an amorphous silicon layer on the back electrode; (a-2) forming a catalytic metal layer on the amorphous silicon layer to perform low-temperature crystallization; and (a-3) heat-treating the transparent insulating substrate to crystallize amorphous silicon included in the amorphous silicon layer located beneath the catalytic metal layer into polycrystalline silicon through a metal induced crystallization (MIC) process.

A further aspect of the present invention provides a method of fabricating a polycrystalline silicon solar cell, including: (a) forming a back electrode on a transparent insulating substrate; (b) forming an amorphous silicon layer on the back electrode; (c) forming a catalytic metal layer on the amorphous silicon layer to perform low-temperature crystallization; (d) primarily heat-treating the transparent insulating substrate to crystallize amorphous silicon included in the amorphous silicon layer located beneath the catalytic metal layer into polycrystalline silicon through a metal induced crystallization (MIC) process; (e) doping the polycrystalline silicon with a first conductive dopant through an ion injection process to form a first conductive polycrystalline silicon layer; (f) forming an intrinsic amorphous silicon layer on the first conductive polycrystalline silicon layer; (g) doping a second conductive dopant to a predetermined depth into the intrinsic amorphous silicon layer through an ion injection process; (h) secondarily heat-treating the transparent insulating substrate to vertically crystallize the intrinsic amorphous silicon layer using the first conductive polycrystalline silicon layer as a seed for crystallization through a metal induced vertical crystallization (MIVC) process, and simultaneously activating the second conductive dopant to form the intrinsic amorphous silicon layer into a light-absorbing layer made of polycrystalline silicon and a second conductive polycrystalline silicon layer; (i) depositing a transparent electrode layer on the second conductive polycrystalline silicon layer; (j) forming front electrodes on the transparent electrode layer; and (k) forming an antireflection coating film to cover the front electrodes and the transparent electrode layer.

A still further aspect of the present invention provides a method of fabricating a polycrystalline silicon solar cell, including: (a) forming a back electrode on a transparent insulating substrate; (b) forming an amorphous silicon layer on the back electrode and simultaneously doping the amorphous silicon layer with a first conductive dopant to form a first conductive amorphous silicon layer; (c) forming a catalytic metal layer on the first conductive amorphous silicon layer to perform low-temperature crystallization; (d) primarily heat-treating the transparent insulating substrate to crystallize amorphous silicon included in the amorphous silicon layer located beneath the catalytic metal layer into a first conductive polycrystalline silicon through a metal induced crystallization (MIC) process to form a first conductive polycrystalline silicon layer; (e) forming an intrinsic amorphous silicon layer on the first conductive polycrystalline silicon layer and simultaneously doping a second conductive dopant to a predetermined depth into the intrinsic amorphous silicon layer through an ion injection process to form a second conductive amorphous silicon layer together with the intrinsic amorphous silicon layer; (f) secondarily heat-treating the transparent insulating substrate to vertically crystallize the intrinsic amorphous silicon layer and the second conductive amorphous silicon layer using the first conductive polycrystalline silicon layer as a seed for crystallization through a metal induced vertical crystallization (MIVC) process, and simultaneously activating the second conductive dopant to form the intrinsic amorphous silicon layer into a light-absorbing layer made of polycrystalline silicon and a second conductive polycrystalline silicon layer; (g) depositing a transparent electrode layer on the second conductive polycrystalline silicon layer; (h) forming front electrodes on the transparent electrode layer; and (i) forming an antireflection coating film to cover the front electrodes and the transparent electrode layer.

The method of fabricating a polycrystalline silicon solar cell may further include: removing the catalytic metal patterns after the primary heat treatment of the transparent insulating substrate.

Further, the method of fabricating a polycrystalline silicon solar cell may further include: removing a part of the uppermost layer of the second conductive polycrystalline silicon layer after the secondary heat treatment of the transparent insulating substrate.

In this case, the primary or secondary heat treatment may be performed at a temperature of 400~600° C. for 30 minutes~4 hours.

Further, the first conductive polycrystalline silicon layer may be an N-type polycrystalline silicon layer, the first conductive dopant may be an N-type dopant, the second conductive dopant may be a P-type dopant, and the second conductive polycrystalline silicon layer may be a P-type polycrystalline silicon layer.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Various objects, advantages and features of the invention will become apparent from the following description of embodiments with reference to the accompanying drawings.

Hereinafter, a preferred embodiment of the present invention will be described in detail with reference to the attached drawings.

Reference now should be made to the drawings, in which the same reference numerals are used throughout the different drawings to designate the same or similar components.

Figure 3A:
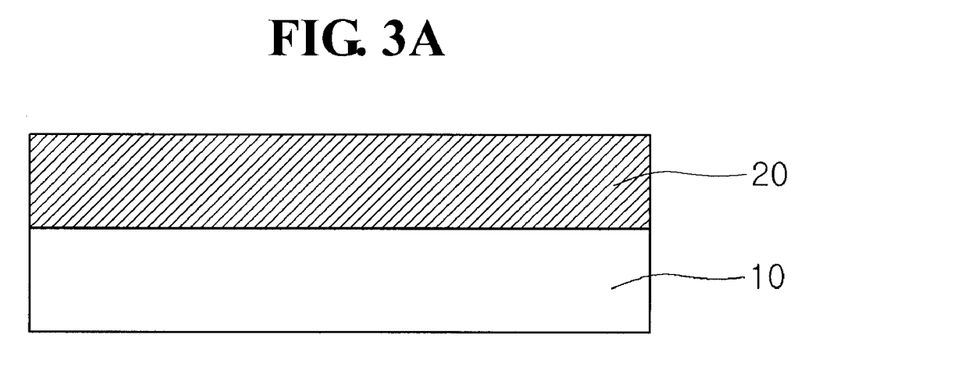
FIGS. 3A to 3K are sectional views showing a method of fabricating a polycrystalline silicon solar cell using a metal induced lateral crystallization (MILC) method and a metal induced vertical crystallization (MIVC) according to an embodiment of the present invention.
Figure 3B:
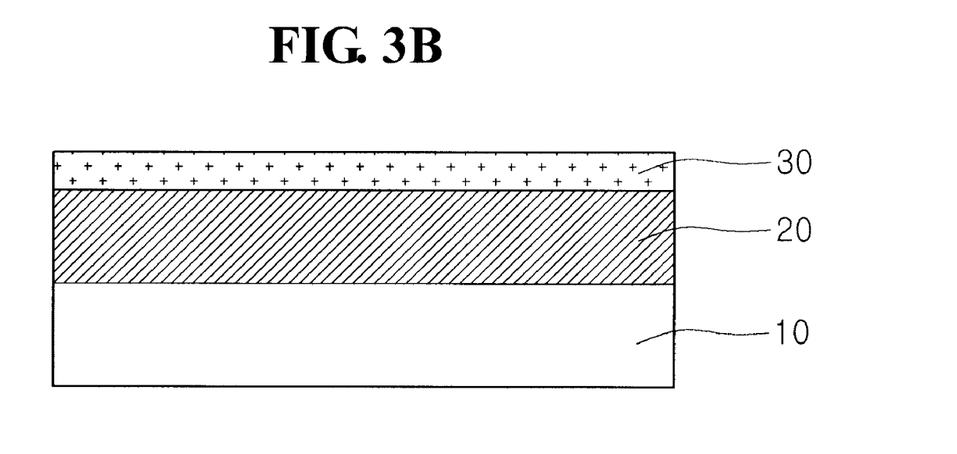
Figure 3C:
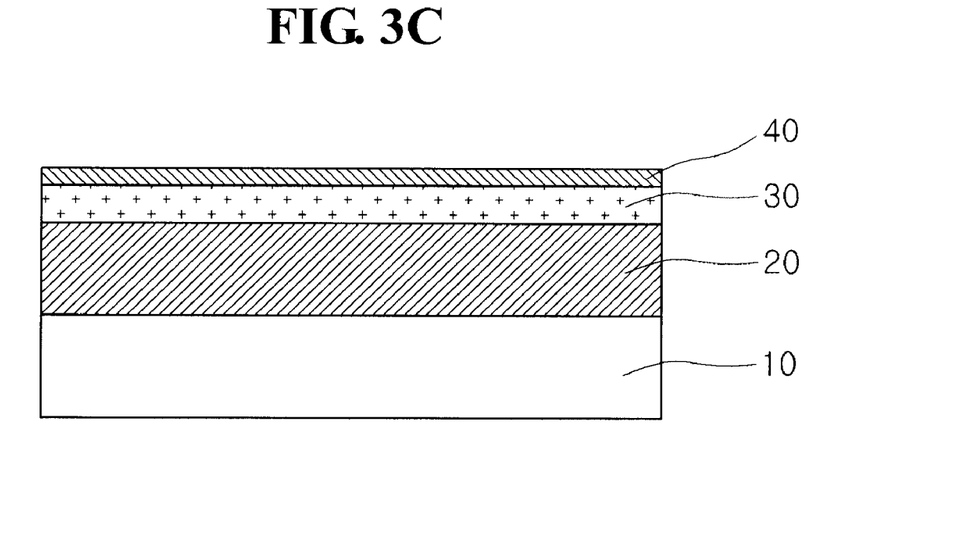
Figure 3D:
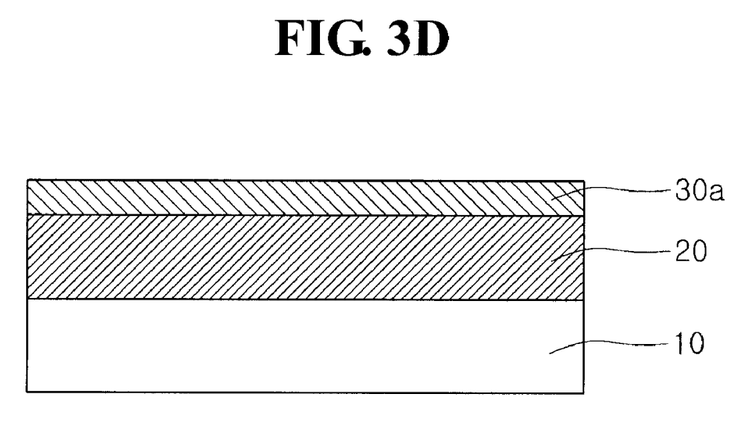
Figure 3E:
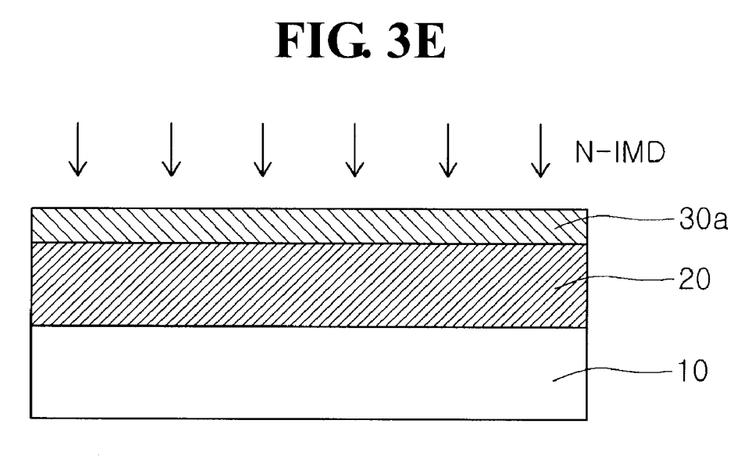
Figure 3F:
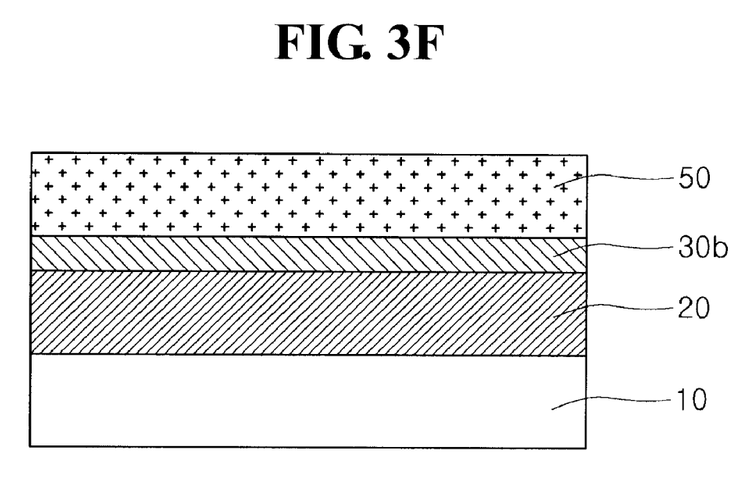
Figure 3G:
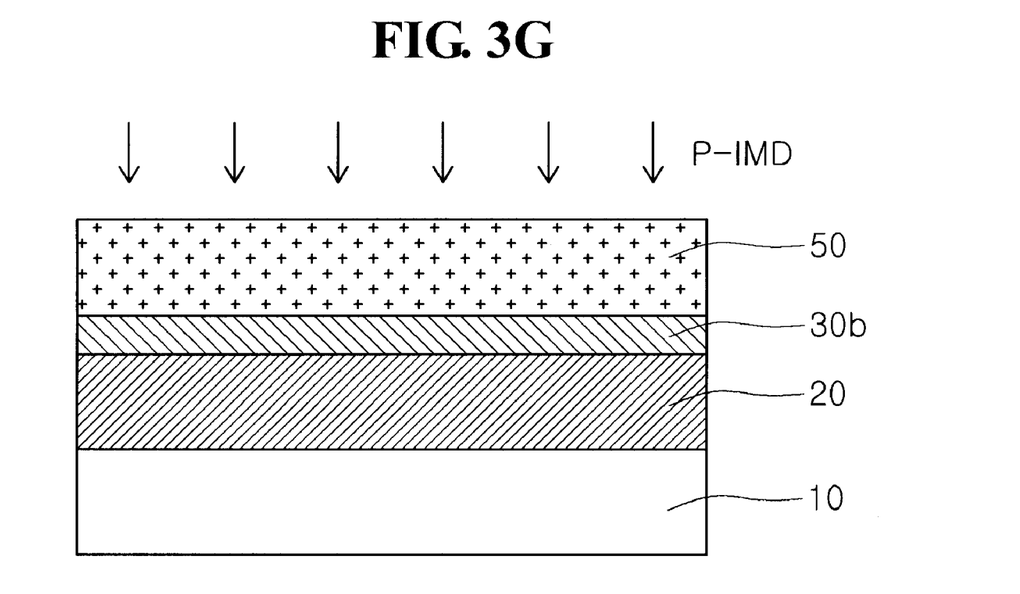
Figure 3H:
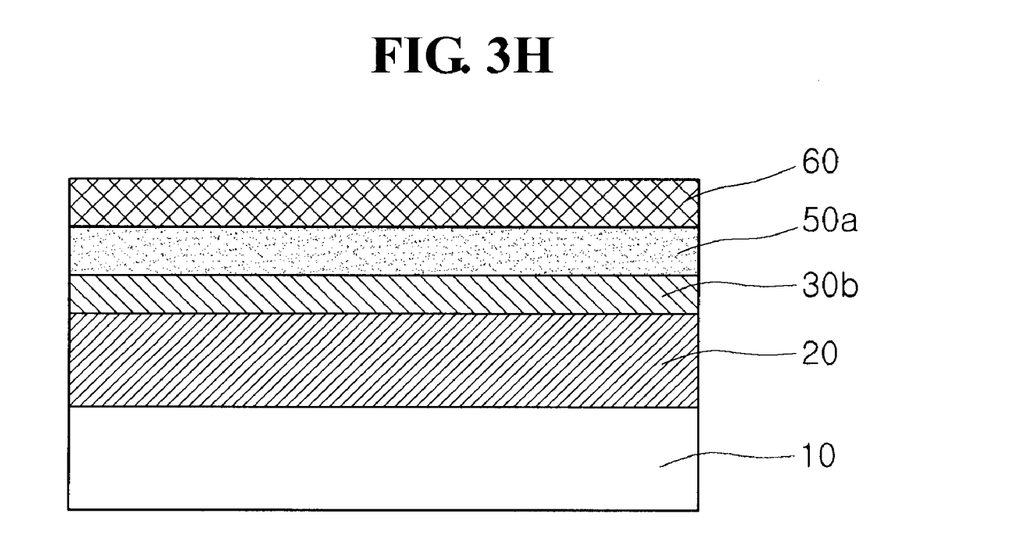
Figure 3I:
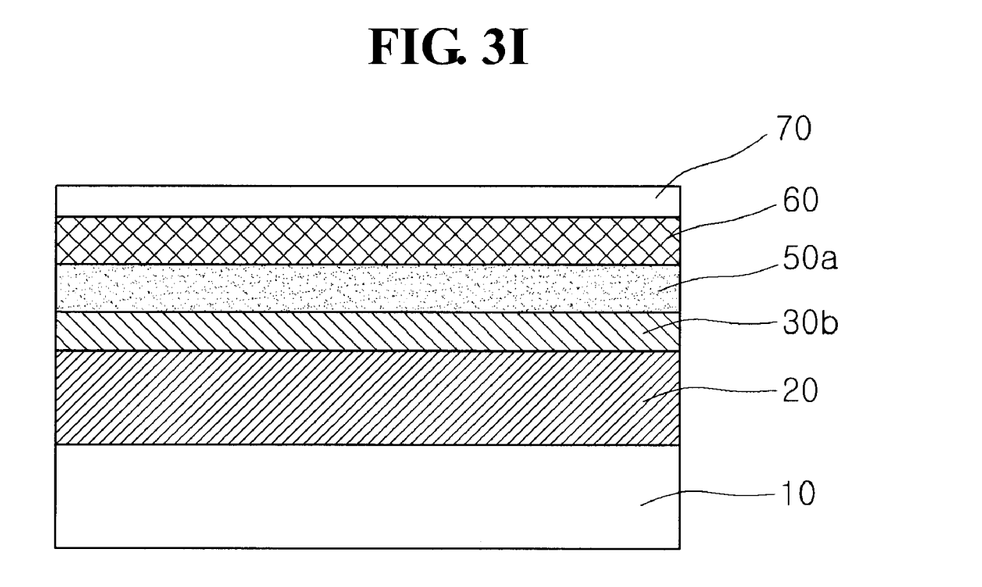
Figure 3J:
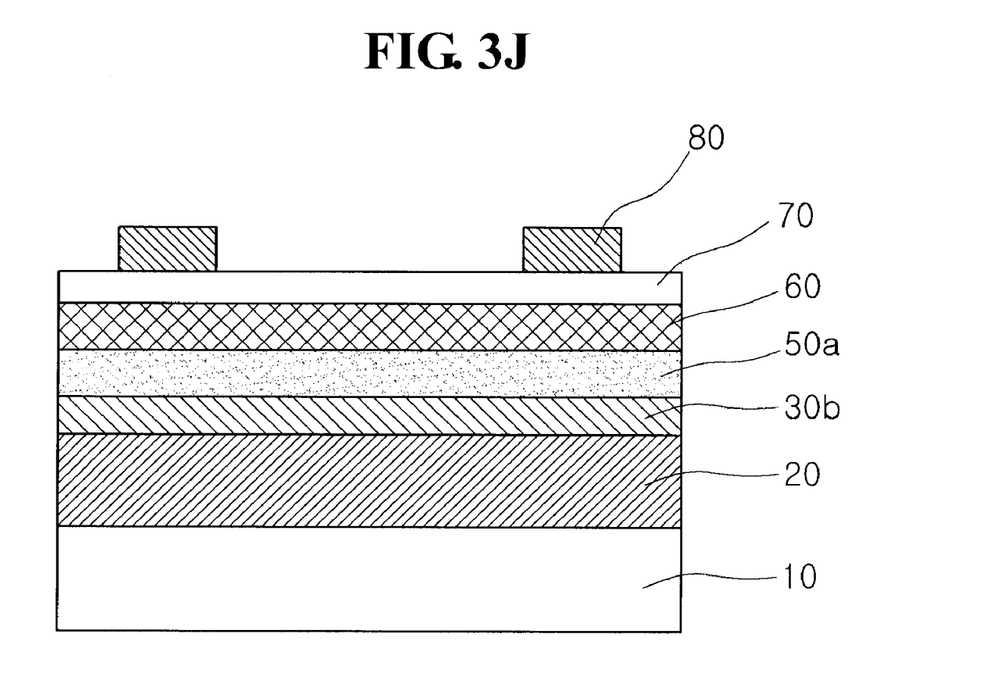
Figure 3K:
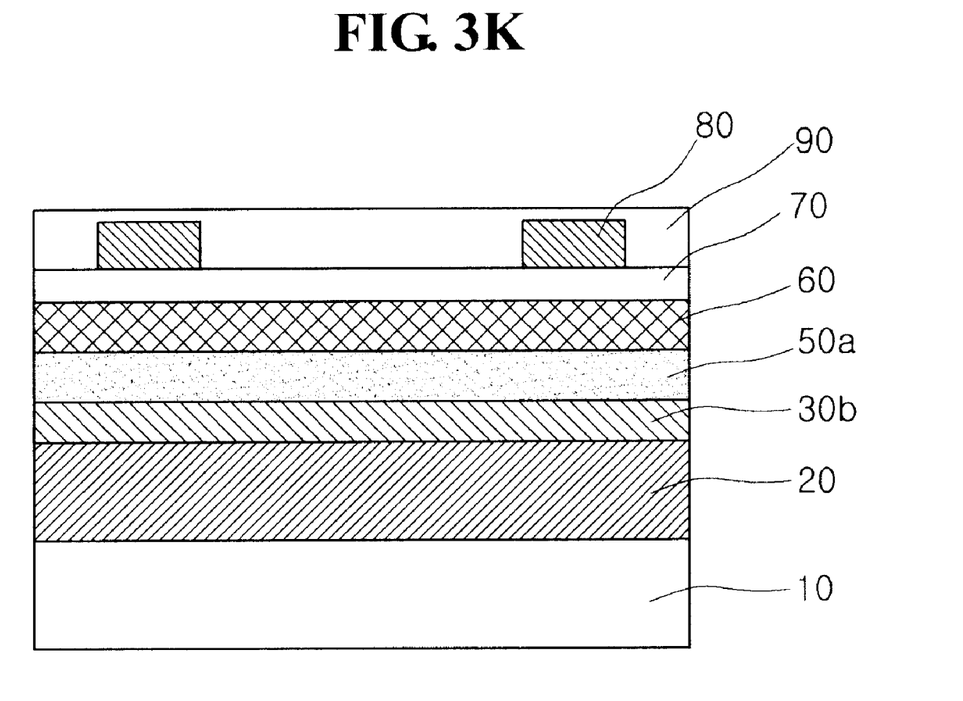

FIG. 3K is a sectional view showing a polycrystalline silicon solar cell according to an embodiment of the present invention.

The polycrystalline silicon solar cell according to an embodiment of the present invention includes: a back electrode 20 formed on a transparent insulating substrate 10; an N-type polycrystalline silicon layer 30b, which is formed on the back electrode 20, in which amorphous silicon is crystallized through a metal induced crystallization (MIC) process, and in which electrons are accumulated; a light-absorbing layer 50a, which is formed on the N-type polycrystalline silicon layer 30b, which is formed by vertically crystallizing an intrinsic amorphous silicon layer using the polycrystalline silicon layer as a seed for crystallization through a metal induced vertical crystallization (MIVC) process, in which pairs of electrons and holes are generated in response to incident light, and which has a vertical column grain structure in which grains are arranged in the direction in which electrons and holes move; a P-type polycrystalline silicon layer 60, which is formed on the light-absorbing layer 50a, which is formed using the same method as in the light-absorbing layer 50a, which has the same vertical column grain structure as the light-absorbing layer 50a, and in which holes are accumulated; a transparent electrode layer 70 formed on the P-type polycrystalline silicon layer 60; front electrodes 80 formed on the transparent electrode layer 70; and an antireflection coating film 90 covering the front electrodes 80 and the transparent electrode layer 70.

In the polycrystalline silicon solar cell according to an embodiment of the present invention, when a light-absorbing layer 50a is formed of polycrystalline silicon, an N-type polycrystalline silicon layer 30b is previously formed beneath the light-absorbing layer 50a through a metal induced crystallization (MIC) method, and then an intrinsic amorphous silicon layer is formed on the N-type polycrystalline silicon layer 30b using this N-type polycrystalline silicon layer 30b made of nonmetal as a seed for crystallization seed and then crystallized into a polycrystalline silicon layer through a metal induced vertical crystallization (MIVC) method.

Further, in the polycrystalline silicon solar cell according to an embodiment of the present invention, amorphous silicon is vertically crystallized using a metal induced vertical crystallization (MIVC) method, and then metal and silicide are removed from the crystallized region, and thus the crystallization of an amorphous silicon thin film can be realized without the contamination of metals Therefore, in the polycrystalline silicon solar cell according to an embodiment of the present invention, the amount of a catalytic metal remaining in the light-absorbing layer 50a is minimized, so that the number of recombination sites of electrons and holes is decreased, thereby improving the efficiency of a solar cell.

Moreover, in the polycrystalline silicon solar cell according to an embodiment of the present invention, when amorphous silicon used to make a light-absorbing layer 50a is formed into polycrystalline silicon, grains 50b of the polycrystalline silicon are vertically grown in the direction in which electrons and holes move using a metal induced vertical crystallization (MIVC) method, so that the particle structure of the polycrystalline silicon is formed into a vertical column structure, with the result that grain boundaries 50c, acting as sites in which electrons and hole are recombined with each other, is minimized, thereby increasing the efficiency of a solar cell.

Hereinafter, a method of fabricating a polycrystalline silicon solar cell according to an embodiment of the present invention will be described with reference to FIGS. 3A to 3K.

FIGS. 3A to 3K are sectional views showing a method of fabricating a polycrystalline silicon solar cell using a metal induced lateral crystallization (MILC) method and a metal induced vertical crystallization (MIVC) according to an embodiment of the present invention.

First, referring to FIG. 3A, a back electrode 20 is formed on a transparent insulating substrate 10 by depositing a metal film having a thickness of 100~500 nm on the transparent insulating substrate 10. The back electrode 20 may be made of various electrode materials, such as MoW, Mo, W, Pt, Ti and the like, and may be produced through a sputtering method or a chemical vapor deposition (CVD) method. The back electrode is connected to a (−) power terminal when an N-type silicon layer 30b is formed thereon.

Subsequently, referring to FIG. 3B, a first conductive amorphous silicon thin film 30, which is to be used as an N-type silicon layer, is deposited to a thickness of 50~200 nm on the back electrode 20 in a CVD chamber through a low pressure chemical vapor deposition (LPCVD) method or a plasma enhanced chemical vapor deposition (PECVD) method. In this case, it is preferred that the amorphous silicon thin film 30 be deposited to a thickness of 100 nm on the back electrode 20.

Thereafter, as shown in FIG. 3C, a catalytic metal layer 40 for crystallization is entirely deposited on the amorphous silicon thin film 30. The catalytic metal layer 40 may be made of any one selected from among Ni, Pd, Ti, Ag, Au, Al, Sn, Sb, Cu, Co, Cr, Mo, Tr, Ru, Rh, Cd, and Pt.

The catalytic metal layer 40 is deposited to a thickness of 1~20 nm. It is preferred that the catalytic metal layer 40 be deposited to a thickness of 10 nm.

Subsequently, referring to FIG. 3D, the amorphous silicon thin film 30 is crystallized into a polycrystalline silicon thin film 30a by performing heat treatment under an air or hydrogen atmosphere, and then the catalytic metal layer 40 is removed. The heat treatment may be performed at a temperature of 400~600° C. for 30 minutes~4 hours.

Through the heat treatment, the amorphous silicon thin film 30 located between the back electrode 20 and the catalytic metal layer 40 is crystallized into a polycrystalline silicon thin film through metal induced crystallization (MIC), and the polycrystalline silicon thin film 30a is used as a seed for crystallizing non metals in subsequent processes.

Thereafter, as shown in FIG. 3E, in order to convert the polycrystalline silicon thin film 30a into an N-type polycrystalline silicon layer, the polycrystalline silicon thin film 30a is doped with $PH_3$ (phosphorous) through an ion injection process to form an N-type polycrystalline silicon layer 30b.

In this case, from FIG. 3B, when an intrinsic amorphous silicon thin film 30, which is to be used as a first conductive silicon layer, for example an N-type silicon layer, is formed on the back electrode in a CVD chamber, $PH_3$ is added together with $SiH_4$ and $H_2$, which are used to form intrinsic silicon, and thus an n+ amorphous silicon thin film may be formed without performing an additional ion injection process, and a process of crystallizing the n+ amorphous silicon thin film can be performed.

Subsequently, as shown in FIG. 3F, an intrinsic amorphous silicon layer 50 is deposited to a thickness of 1~3 μm on the N-type polycrystalline silicon layer 30b through a LPCVD or PECVD method in order to form a light-absorbing layer.

Thereafter, as shown in FIG. 3G, the intrinsic amorphous silicon layer 50 is doped with a second conductive dopant, for example a P-type dopant, through an ion injection process. It is preferred that the P-type dopant, for example boron or $B_2H_6$, be doped to a depth of 1000 Å of the intrinsic amorphous silicon layer 50 such that it is doped only on the intrinsic amorphous silicon layer 50.

In addition to this, in FIG. 3F, after an intrinsic amorphous silicon layer is formed, $B_2H_6$ is injected into the intrinsic amorphous silicon layer, so that the intrinsic amorphous silicon layer is doped with a P-type dopant, thereby a p+ silicon layer may also be formed.

Subsequently, as shown in FIG. 3H, when secondary heat treatment is performed under a hydrogen atmosphere, since the N-type polycrystalline silicon layer 30b, which is located beneath the intrinsic amorphous silicon layer 50, is used as a seed for crystallizing the intrinsic amorphous silicon layer 50, amorphous silicon included in the intrinsic amorphous silicon layer 50 is vertically crystallized by a catalytic metal and silicide present in the N-type polycrystalline silicon layer 30b through a metal induced vertical crystallization (MIVC) method.

Figure 4:
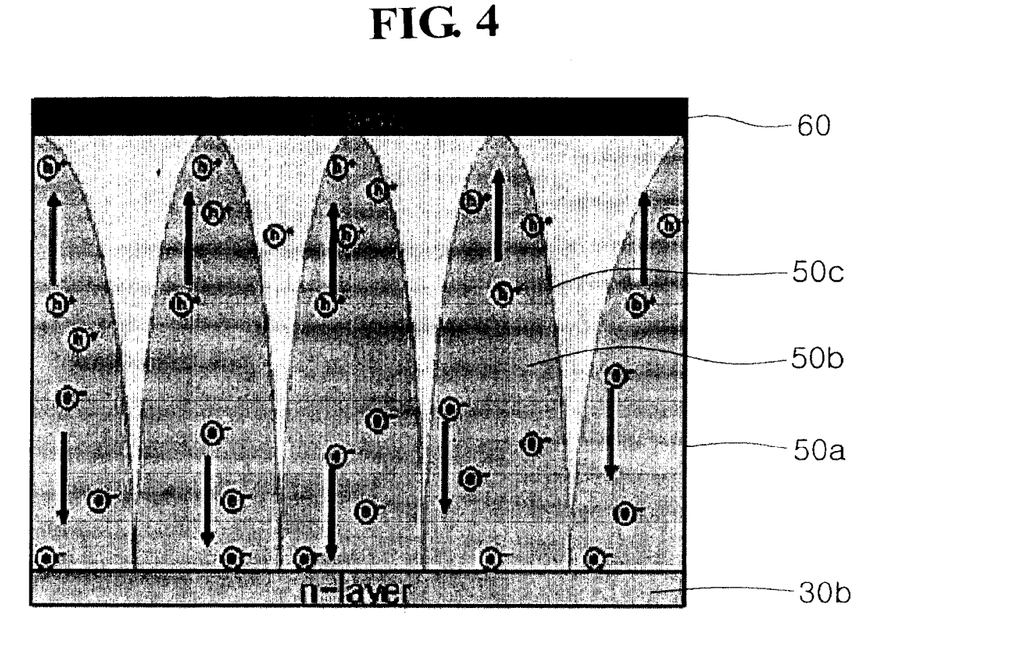
FIG. 4 is a sectional view showing the recombination of holes and electrons through grain boundaries when grains are vertically grown in a polycrystalline silicon light-absorbing layer according to an embodiment of the present invention.

When metal induced vertical crystallization (MIVC) method is performed, grains are grown parallel to the direction in which electrons and holes move, as shown in FIG. 4.

Figure 5:
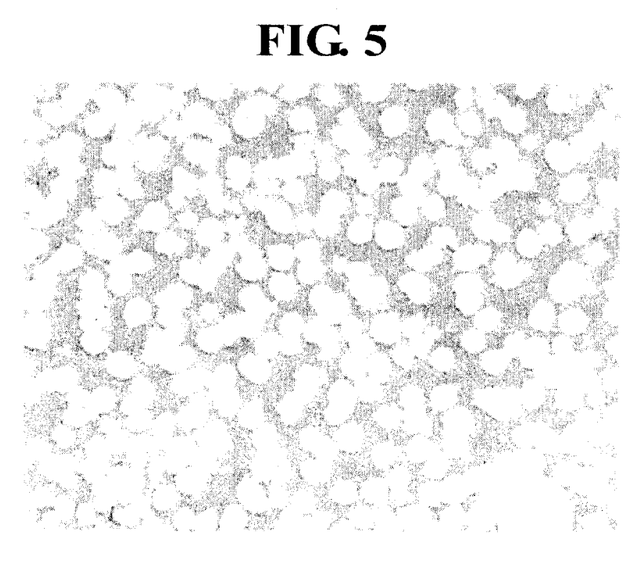
FIG. 5 is a photograph showing vertically grown polycrystalline silicon using an optical microscope when a metal induced vertical crystallization (MIVC) is used according to an embodiment of the present invention.

FIG. 4 is a sectional view showing the recombination of holes and electrons through grain boundaries when grains are vertically grown in a polycrystalline silicon light-absorbing layer crystallized through the MIVC method according to an embodiment of the present invention, and FIG. 5 is an enlarged photograph showing vertically grown polycrystalline silicon using an optical microscope when the MIVC method is used according to an embodiment of the present invention.

From FIGS. 4 and 5, it can be seen that the particle structure of the polycrystalline silicon according to the present invention is a vertical columnar structure in which grains are vertically grown As described above, in the present invention, the crystallization of amorphous silicon is vertically conducted by using polycrystalline silicon included in the N-type polycrystalline silicon layer 30b as a seed for crystallizing the amorphous silicon. Like this, at the time of the crystallization of the amorphous silicon, the particle structure of polycrystalline silicon is formed into a vertical column structure by vertically growing and controlling grains 50b, and thus grain boundaries 50c, acting as recombination sites of electrons and holes, are minimized in the direction in which electrons and holes are grown. As a result, the recombination frequency of electrons ($(e)^-$) and holes ($(h)^+$) generated from the light-absorbing layer 50a is decreased, thus maximizing the efficiency of a solar cell.

Further, when the secondary heat treatment is performed under the hydrogen atmosphere, the boron, which is doped on the N-type polycrystalline silicon layer 30b doped with $PH_3$ (phosphorous) and the intrinsic amorphous silicon layer 50, is activated.

Therethrough, the upper part of the intrinsic amorphous silicon layer 50 doped with the P-type dopant is crystallized by the catalytic metal and silicide and is thus converted into a P-type polycrystalline silicon layer 60, and the lower part thereof which is not doped with the P-type dopant is converted into a light-absorbing layer 50a.

It is preferred that the secondary heat treatment for crystallizing the amorphous silicon layer 50 be performed under a hydrogen atmosphere, and trapping sites (dangling bonds, etc.) be passivated.

Meanwhile, when the secondary heat treatment of the amorphous silicon layer 50 is conducted, the catalytic metal and silicide present in the N-type polycrystalline silicon layer 30b move to the uppermost end of the P-type polycrystalline silicon layer 60. Here, since the catalytic metal and silicide are pollutants decreasing the efficiency of a solar cell, they are required to be removed.

Therefore, when the secondary heat treatment of the amorphous silicon layer 50 is completed, the catalytic metal and silicide present at the uppermost end of the P-type polycrystalline silicon layer 60 are removed. The catalytic metal may be removed through a chemical mechanical polishing (CMP) process or a well known surface etching process.

Subsequently, as shown in FIG. 3I, a transparent electrode layer 70 is formed on the P-type polycrystalline silicon layer 60. The transparent electrode layer 70 may be made of ITO or ZnO to have a thickness of 100~600 nm, preferably 300 nm.

Thereafter, as shown in FIG. 3J, front electrodes 80 made of metals are formed on the transparent electrode layer 70. The front electrodes 80 are formed by disposing metal films having a thickness of 100~300 nm at intervals of mm, and may be made of all usable electrode materials such as Al, Ni, Mo, W, Ti and the like. Further, the front electrodes 80 are disposed at intervals of mm, connected to each other, and connected to a (+) power terminal.

Subsequently, as shown in FIG. 3K, an anti-reflection coating film 90 made of SiNx is formed to cover the front electrodes 80 and the transparent electrode layer 70.

In this embodiment, when an intrinsic amorphous silicon layer 50 is crystallized to form a light-absorbing layer 50a, polycrystalline silicon included in the N-type polycrystalline silicon layer 30b is used as a seed for crystallizing the intrinsic amorphous silicon layer 50. However, in the present invention, instead of using the polycrystalline silicon produced by crystallizing amorphous silicon through MIC as a seed for crystallizing the amorphous silicon, the polycrystalline silicon produced by simultaneously supplying a small amount of a catalytic metal source at the time of forming an amorphous silicon layer to form a mixed layer of silicon and the catalytic metal (for example, Ni) and then heat-treating the mixed layer to crystallize it at low temperature may also be used as the seed for crystallizing the amorphous silicon.

Further, in this embodiment, dopant ions are doped through an ion injection process, but they may be doped through a well known ion shower or diffusion process. Additionally, a conductive layer can also be formed by injecting dopant gas while forming an intrinsic silicon layer.

Moreover, in this embodiment, a light-absorbing layer 50a made of intrinsic polycrystalline silicon is disposed between an N-type polycrystalline silicon layer 30b and a P-type polycrystalline silicon layer 60, but the P-type polycrystalline silicon layer 60 may be directly formed on the N-type polycrystalline silicon layer 30b without forming the light-absorbing layer 50a. In this case, a depleting layer, serving as a light-absorbing layer, is spontaneously formed on the P-N junction of the P-type polycrystalline silicon layer 60 and the N-type polycrystalline silicon layer 30b.

Furthermore, in this embodiment, the light-absorbing layer 90a is made of intrinsic polycrystalline silicon, but a P-type or N-type silicon layer slightly doped with a P-type or N-type dopant may be used as the light-absorbing layer 50a.

Meanwhile, in this embodiment, an N-type polycrystalline silicon layer 30b is formed beneath a light-absorbing layer 50a, and a P-type polycrystalline silicon layer 60 is formed on the light-absorbing layer 50a. However, conversely, the N-type polycrystalline silicon layer 30b may be formed on the light-absorbing layer 50a, and the P-type polycrystalline silicon layer 60 may be formed beneath the light-absorbing layer 50a.

As described above, according to the present invention, when a light-absorbing layer is formed of polycrystalline silicon, a polycrystalline silicon layer is previously formed beneath the light-absorbing layer, and then an intrinsic amorphous silicon layer, which is located on the polycrystalline silicon layer, is crystallized into the polycrystalline silicon layer using this polycrystalline silicon layer made of nonmetal as a seed for crystallization seed through a metal induced vertical crystallization (MIVC) method, so that the amount of a catalytic metal remaining in the light-absorbing layer is minimized, with the result that the number of recombination sites of electrons and holes is decreased, thereby improving the efficiency of a solar cell.

Further, according to the present invention, since amorphous silicon is crystallized using a metal induced crystallization (MIC) method and a metal induced lateral crystallization (MILC) method, several substrates can be simultaneously crystallized at a relatively low temperature of 300~500° C. using a furnace without damaging a glass substrate, thus improving productivity.

Moreover, according to the present invention, when amorphous silicon used to make a light-absorbing layer is formed into polycrystalline silicon, grains of the polycrystalline silicon are vertically grown in the direction in which electrons and holes move using a metal induced vertical crystallization (MIVC) method, so that the particle structure of the polycrystalline silicon is formed into a vertical column structure, with the result that grain boundaries, acting as sites in which electrons and hole are recombined with each other, is minimized, thereby increasing the efficiency of a solar cell.

Furthermore, according to the present invention, amorphous silicon is vertically crystallized using a metal induced vertical crystallization (MIVC) method and then metal and silicide are removed from the crystallized region, and thus the crystallization of an amorphous silicon thin film is realized without the contamination of metals, thereby fabricating a solar cell having excellent properties.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of forming a light-absorbing layer of a polycrystalline silicon solar cell, comprising:
    (a) forming a polycrystalline silicon layer on a back electrode formed on a transparent insulating substrate;
    (b) forming an intrinsic amorphous silicon layer on the polycrystalline silicon layer; and
    (c) heat-treating the transparent insulating substrate to vertically crystallize the intrinsic amorphous silicon layer using the polycrystalline silicon layer as a seed for crystallization through a metal induced vertical crystallization (MIVC) process to form the intrinsic amorphous silicon layer into a light-absorbing layer made of polycrystalline silicon.

2. The method of forming a light-absorbing layer of a polycrystalline silicon solar cell according to claim 1, wherein the forming of the polycrystalline silicon layer comprises:
    (a-1) forming an amorphous silicon layer on the back electrode;
    (a-2) forming a catalytic metal layer on the amorphous silicon layer to perform low-temperature crystallization; and
    (a-3) heat-treating the transparent insulating substrate to crystallize amorphous silicon included in the amorphous silicon layer located beneath the catalytic metal layer into polycrystalline silicon through a metal induced crystallization (MIC) process.

3. The method of forming a light-absorbing layer of a polycrystalline silicon solar cell according to claim 2, wherein the amorphous silicon layer is deposited to a thickness of 50~200 nm in a CVD chamber through a low pressure chemical vapor deposition (LPCVD) or a plasma enhanced chemical vapor deposition (PECVD) process.

4. A method of fabricating a polycrystalline silicon solar cell, comprising:
    (a) forming a back electrode on a transparent insulating substrate;
    (b) forming an amorphous silicon layer on the back electrode;
    (c) forming a catalytic metal layer on the amorphous silicon layer to perform low-temperature crystallization;
    (d) primarily heat-treating the transparent insulating substrate to crystallize amorphous silicon included in the amorphous silicon layer located beneath the catalytic metal layer into polycrystalline silicon through a metal induced crystallization (MIC) process;
    (e) doping the polycrystalline silicon with a first conductive dopant through an ion injection process to form a first conductive polycrystalline silicon layer;
    (f) forming an intrinsic amorphous silicon layer on the first conductive polycrystalline silicon layer;
    (g) doping a second conductive dopant to a predetermined depth into the intrinsic amorphous silicon layer through an ion injection process;
    (h) secondarily heat-treating the transparent insulating substrate to vertically crystallize the intrinsic amorphous silicon layer using the first conductive polycrystalline silicon layer as a seed for crystallization through a metal induced vertical crystallization (MIVC) process, and simultaneously activating the second conductive dopant to form the intrinsic amorphous silicon layer into a light-absorbing layer made of polycrystalline silicon and a second conductive polycrystalline silicon layer;

(i) depositing a transparent electrode layer on the second conductive polycrystalline silicon layer;

(j) forming front electrodes on the transparent electrode layer; and (k) forming an antireflection coating film to cover the front electrodes and the transparent electrode layer.

5. The method of fabricating a polycrystalline silicon solar cell according to claim 4, further comprising:
removing the catalytic metal patterns after the primary heat treatment of the transparent insulating substrate.

6. The method of fabricating a polycrystalline silicon solar cell according to claim 4, further comprising:
removing a part of the uppermost layer of the second conductive polycrystalline silicon layer after the secondary heat treatment of the transparent insulating substrate.

7. The method of fabricating a polycrystalline silicon solar cell according to claim 4, wherein the primary or secondary heat treatment is performed at a temperature of 400~600° C. for 30 minutes~4 hours.

8. The method of fabricating a polycrystalline silicon solar cell according to claim 4, wherein the first conductive polycrystalline silicon layer is an N-type polycrystalline silicon layer, the first conductive dopant is a N-type dopant, the second conductive dopant is a P-type dopant, and the second conductive polycrystalline silicon layer is a P-type polycrystalline silicon layer.

9. The method of fabricating a polycrystalline silicon solar cell according to claim 4, wherein the catalytic metal layer is deposited to a thickness of 1~20 nm.

10. A method of fabricating a polycrystalline silicon solar cell, comprising:

(a) forming a back electrode on a transparent insulating substrate;

(b) forming an amorphous silicon layer on the back electrode and doping the amorphous silicon layer with a first conductive dopant to form a first conductive amorphous silicon layer;

(c) forming a catalytic metal layer on the first conductive amorphous silicon layer to perform low-temperature crystallization;

(d) primarily heat-treating the transparent insulating substrate to crystallize amorphous silicon included in the amorphous silicon layer located beneath the catalytic metal layer into a first conductive polycrystalline silicon through a metal induced crystallization (MIC) process to form a first conductive polycrystalline silicon layer;

(e) forming an intrinsic amorphous silicon layer on the first conductive polycrystalline silicon layer and doping a second conductive dopant to a predetermined depth into the intrinsic amorphous silicon layer through an ion injection process to form a second conductive amorphous silicon layer together with the intrinsic amorphous silicon layer;

(f) secondarily heat-treating the transparent insulating substrate to vertically crystallize the intrinsic amorphous silicon layer and the second conductive amorphous silicon layer using the first conductive polycrystalline silicon layer as a seed for crystallization through a metal induced vertical crystallization (MIVC) process, and simultaneously activating the second conductive dopant to form the intrinsic amorphous silicon layer into a light-absorbing layer made of polycrystalline silicon and a second conductive polycrystalline silicon layer;

(g) depositing a transparent electrode layer on the second conductive polycrystalline silicon layer;

(h) forming front electrodes on the transparent electrode layer; and (i) forming an antireflection coating film to cover the front electrodes and the transparent electrode layer.

11. The method of fabricating a polycrystalline silicon solar cell according to claim 10, further comprising:
removing the catalytic metal patterns after the primary heat treatment of the transparent insulating substrate.

12. The method of fabricating a polycrystalline silicon solar cell according to claim 10, further comprising:
removing a part of the uppermost layer of the second conductive polycrystalline silicon layer after the secondary heat treatment of the transparent insulating substrate.

13. The method of fabricating a polycrystalline silicon solar cell according to claim 10, wherein the primary or secondary heat treatment is performed at a temperature of 400~600° C. for 30 minutes ~4 hours.

14. The method of fabricating a polycrystalline silicon solar cell according to claim 10, wherein the first conductive polycrystalline silicon layer is an N-type polycrystalline silicon layer, the first conductive dopant is a N-type dopant, the second conductive dopant is a P-type dopant, and the second conductive polycrystalline silicon layer is a P-type polycrystalline silicon layer.

15. The method of fabricating a polycrystalline silicon solar cell according to claim 10, wherein the catalytic metal layer is deposited to a thickness of 1~20 nm.

* * * * *